(12) United States Patent
Wang et al.

(10) Patent No.: US 9,502,383 B2
(45) Date of Patent: Nov. 22, 2016

(54) 3D INTEGRATED CIRCUIT PACKAGE PROCESSING WITH PANEL TYPE LID

(71) Applicant: Taiwan Semiconductor Manufacturing Company, Ltd., Hsin-Chu (TW)

(72) Inventors: Tsung-Ding Wang, Tainan (TW); Han-Ping Pu, Taichung (TW); Kim Hong Chen, Fremont, CA (US); Jung Wei Cheng, Hsin-Chu (TW); Chien Ling Hwang, Hsin-Chu (TW); Hsin-Yu Pan, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 81 days.

(21) Appl. No.: 14/206,870

(22) Filed: Mar. 12, 2014

(65) Prior Publication Data
US 2015/0262973 A1    Sep. 17, 2015

(51) Int. Cl.
| | |
|---|---|
| H01L 25/065 | (2006.01) |
| H01L 23/42 | (2006.01) |
| H01L 23/00 | (2006.01) |
| H01L 21/78 | (2006.01) |
| H01L 25/00 | (2006.01) |
| H01L 23/367 | (2006.01) |
| H01L 23/04 | (2006.01) |
| H01L 23/10 | (2006.01) |
| H01L 23/498 | (2006.01) |

(52) U.S. Cl.
CPC ........... *H01L 25/0657* (2013.01); *H01L 21/78* (2013.01); *H01L 23/04* (2013.01); *H01L 23/10* (2013.01); *H01L 23/367* (2013.01); *H01L 23/42* (2013.01); *H01L 23/564* (2013.01); *H01L 24/92* (2013.01); *H01L 24/97* (2013.01); *H01L 25/50* (2013.01); *H01L 23/3675* (2013.01); *H01L 23/49827* (2013.01); *H01L 2224/16225* (2013.01); *H01L 2224/32225* (2013.01); *H01L 2224/73204* (2013.01); *H01L 2224/73253* (2013.01); *H01L 2225/06589* (2013.01); *H01L 2924/12042* (2013.01); *H01L 2924/15311* (2013.01)

(58) Field of Classification Search
CPC ........................... H01L 25/0657; H01L 23/42
See application file for complete search history.

(56) References Cited

U.S. PATENT DOCUMENTS

| | | | | |
|---|---|---|---|---|
| 2006/0109630 | A1* | 5/2006 | Colgan | ............... H01L 23/42 361/718 |
| 2014/0134804 | A1* | 5/2014 | Kelly | ............... H01L 23/147 438/118 |
| 2014/0306327 | A1* | 10/2014 | Schulze | ............... H01L 21/52 257/666 |

* cited by examiner

*Primary Examiner* — Mamadou Diallo
(74) *Attorney, Agent, or Firm* — Slater Matsil, LLP

(57) ABSTRACT

Presented herein is a package comprising a carrier device of a device stack and at least one top device of the device stack mounted on a first side of the carrier device. A lid is mounted on the first side of the carrier device, with a first portion of the lid attached to the carrier device and a second portion of the lid extending past and overhanging a respective edge of the carrier device. The lid comprises a recess disposed in a first side, and the at least one top device is disposed within the recess. A thermal interface material disposed on the top device and contacts a surface of the recess.

17 Claims, 7 Drawing Sheets

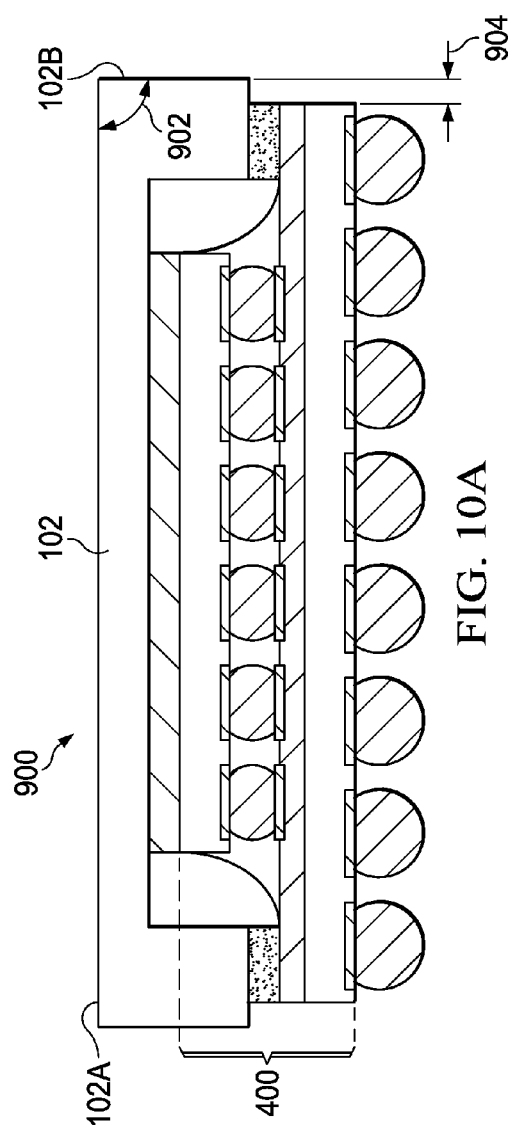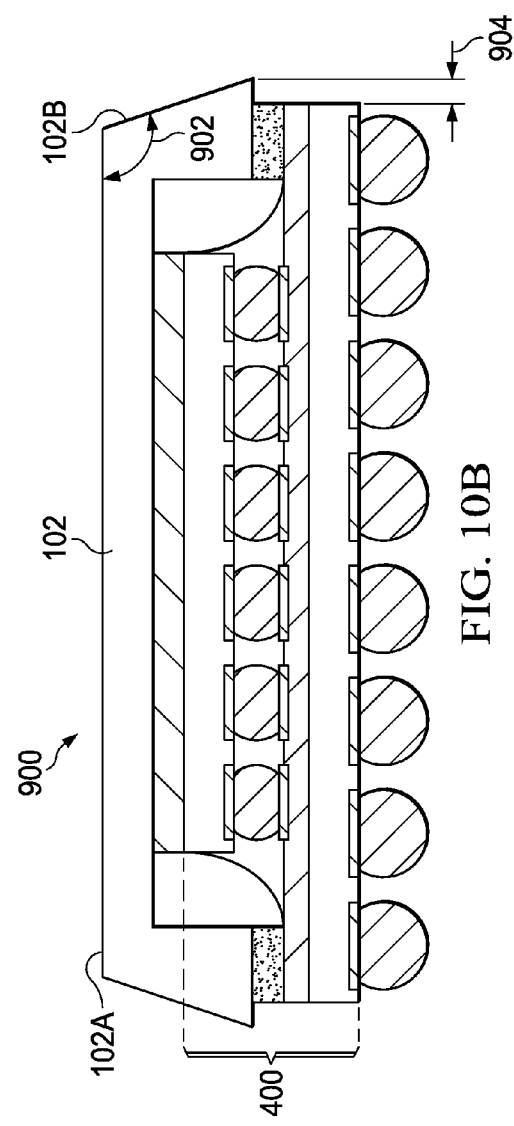

3D INTEGRATED CIRCUIT PACKAGE PROCESSING WITH PANEL TYPE LID

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In some devices, multiple dies are stacked vertically to reduce the footprint of a device package and permit dies with different processing technologies to be interconnected. As the sizes of active devices on a die shrink, the heat dissipation for the increasingly compact active devices is managed by attaching a lid over the stacked dies. The lid protects the dies and provides a path to conduct heat away from the dies.

BRIEF DESCRIPTION OF THE DRAWINGS

Aspects of the present disclosure are best understood from the following detailed description when read with the accompanying figures. Corresponding numerals and symbols in the different figures generally refer to corresponding parts unless otherwise indicated. The figures are drawn to illustrate the relevant aspects of the embodiments and it should be noted that, in accordance with the standard practice in the industry, various features are not drawn to scale. In fact, the dimensions of the various features may be arbitrarily increased or reduced for clarity of discussion.

FIGS. 10A-10B are cross-sectional views illustrating singulated package arrangements according to some embodiments.

DETAILED DESCRIPTION

Figure 1:
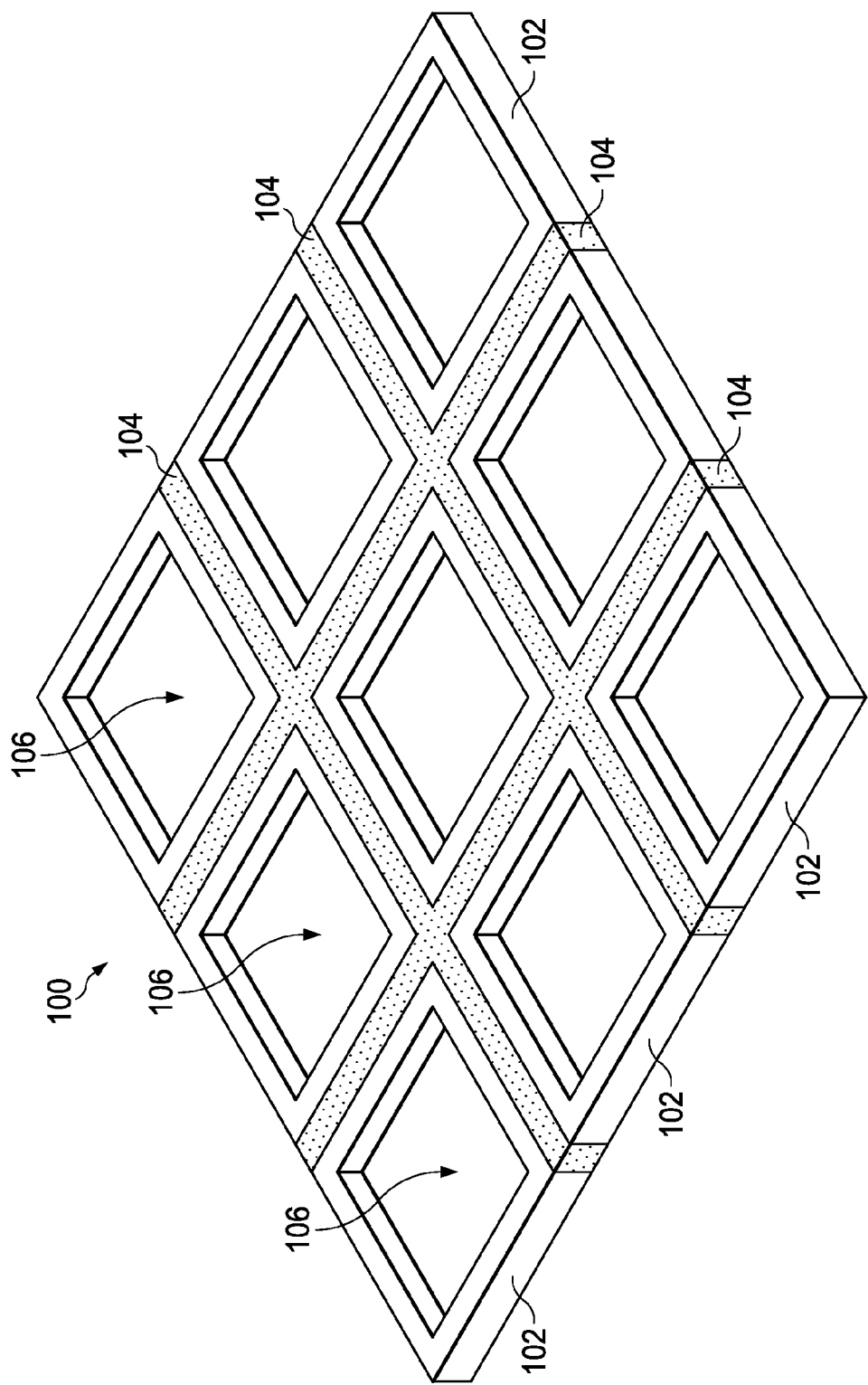
FIG. 1 is a perspective view illustrating a lid panel in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three dimensional integrated circuit (3D IC) packages are commonly formed by stacking one or more devices or dies vertically. These devices are attached by way of, for example, a ball grid array (BGA), a land grid arrays (LGA), solder balls, studs, wire bonds, or other conductive connectors so that the devices can communicate with each other, and with a substrate, package, PCB or the like on which the device stack is mounted. The density of the devices, as well as the processing power of each package, generates heat that is dispersed to permit higher clock speeds and greater processing power. A heat conductive lid is attached over the device stack to provide protection and heat dissipation.

Disclosed herein is a method for mounting device stacks on panels with multiple lids prior to separating the lids to singulate the packages. It has been discovered that a panel type lid arrangement permits handling of packages with lids in bulk, increasing device processing throughput and consistency.

FIG. 1 is a perspective view illustrating a lid panel 100 in accordance with some embodiments. A lid panel 100 has one or more lids 102, each of the lids 102 separated from adjacent lids 102 by dicing streets 104. In an embodiment, the lids 102 are made from a heat conductive material such as copper, aluminum, magnesium, steel, a polymer, a ceramic or another material. Additionally, in some embodiments, the lid 102 may have a coating nickel, titanium or the like to prevent corrosion or enhance bonding of the lids 102 to a device. For example, a copper lid may have a nickel coating to prevent corrosion or contamination of subsequent processing steps. In such embodiments, the lids 102 are used as heat sinks and protective covers. In an embodiment, each lid 102 has a recess 106 disposed in one side of the lid 102 and extending partially through the lid 102. In such an embodiment, the recess 106 accepts a portion of a device stack, and the rim of the lid 102 attaches to the border of a device in device stack to form a sealed interior region.

The dicing streets 104 separating the lids 102 in the lid panel 100 are a region where the lids 102 are cut apart during subsequent processing. In some embodiments, a saw, laser, waterjet, or the like cuts between the lids 102, along the dicing street 104, separating the lids 102. In other embodiments, the lids 102 may be attached to a carrier or the like, and the carrier may be cut during singulation.

In some embodiments, the dicing streets 104 are made from the same material as the lids 102. In an embodiment, the lid panel 100 is stamped, machined or pressed from a single sheet of material, and the dicing streets 104 are the same material as the lids 102. In other embodiments, the dicing streets 104 are formed from a material different than the lids. For example, the dicing streets 104 may be a material such as aluminum, a polymer, or the like, that is softer or more easily cut than the material of the lids 102 which, in such an example, may be stainless steel.

Figure 2A:
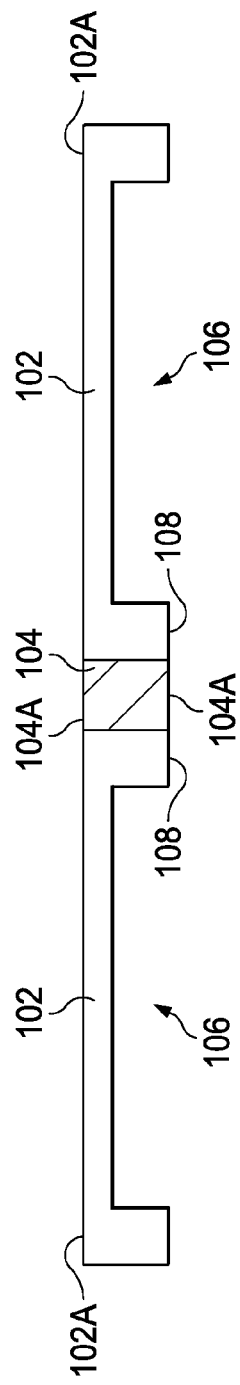
FIGS. 2A-2C are cross-sectional views illustrating lids with dicing street arrangements according to some embodiments.

FIG. 2A is a cross-sectional view illustrating lids 102 with a dicing street 104 according to some embodiments. In such embodiments, lids 102 have a dicing street 104 separating the lids 102, with the dicing street surfaces 104A about level with the surfaces of the lids 102. The top lid surface 102A has a region adjacent to the dicing street 104 that is about level with, or substantially planar with, the top dicing street surface 104A, and the surface of the lid rim 108 is about level with, or substantially planar with, the bottom dicing street surface 104A. Additionally, while the top lid surface 102A is shown as substantially planar across the lid 102, the lid 102 is not limited to the depicted embodiment. In other embodiments, the top lid surface 102A is non-planar, such as in an embodiment where the lid panel 100 is stamped from a single sheet.

Figure 2B:
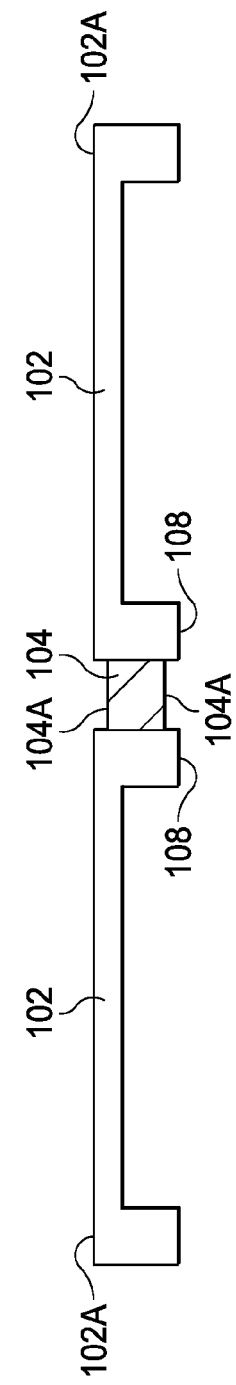

FIG. 2B is a cross-sectional view illustrating lids 102 with an alternative dicing street 104 arrangement according to some embodiments. In such embodiments, the top and bottom dicing street surfaces 104A are recessed from the surface of the lid rim 108 and the top lid surface 102A. In such an embodiment, the lid panel 100 is, for example, milled or stamped from a single sheet, with the dicing streets surfaces 104A recessed to reduce the amount of material cut during lid singulation.

Figure 2C:
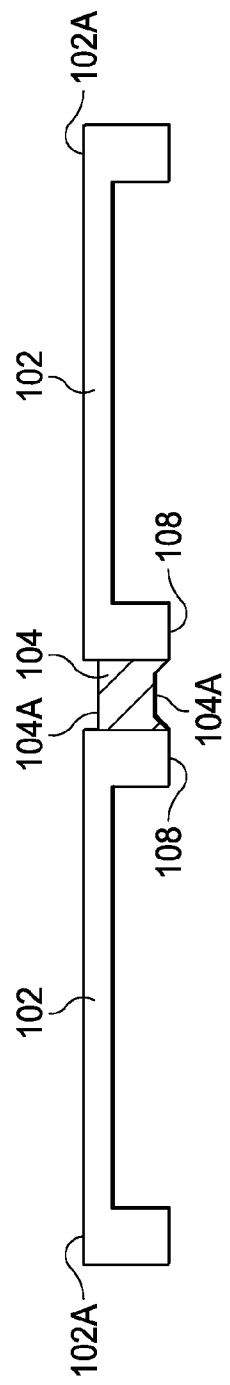

FIG. 2C is a cross-sectional view illustrating lids 102 with an alternative dicing street 104 arrangement according to some embodiments. In such embodiments, one or both of the top and bottom dicing street surfaces 104A are non-planar. In the depicted embodiment, the bottom dicing street surface 104A is non-planar, with a surface extending from the lid rim 108 to a region recessed from the lid rim 108. In such an embodiment, the lid panel 100 is, for example, milled or stamped from a single sheet, with the dicing street surfaces 104A recessed or shaped to reduce the amount of material cut during lid singulation and to assist in aligning the singulation saw.

Figure 3:
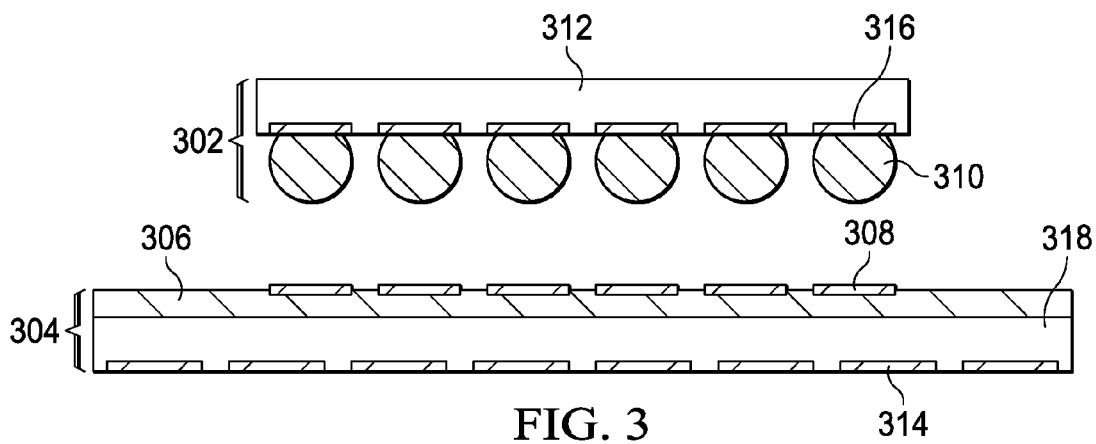
FIGS. 3-9 are cross-sectional views illustrating formation of packages with lids according to some embodiments.

FIG. 3 illustrates an initial step in formation of packages with lids 102 according to some embodiments. A carrier device 304 and one or more top devices 302 are initially provided. In an embodiment, the top device 302 is narrower than the carrier device 304, and a portion of the top surface of the carrier device 304 extend past the edges of the top device 302. In some embodiments, the carrier device 304 and top device 302 are dies, substrates, carriers, or the like and have one or more active devices. For example, in an embodiment, the carrier device 304 is a processor, and the top device 302 is a memory die. In other embodiments, one of the top devices 302 is a redistribution layer (RDL) die or via die with one or more vias or metal layers disposed in a plurality of dielectric layers, and additional top devices 302 may be provided for mounting on the RDL die.

The top device 302 has a substrate 312 with one or more lands 316 disposed on a bottom surface and one or more connectors 310 are formed on the lands 316. In some embodiments, the connectors 310 are solder balls, solder ball array, studs, bumps, a land grid array (LGA), or another conductive structure. In an embodiment, the lands 316 are formed in a RDL (not shown), with the RDL on the bottom of the top device 302.

In an embodiment, the carrier device 304 has a substrate 318 with an RDL 306 disposed on the top surface. The RDL 306 has one or more lands 308 disposed though the top surface, with the lands 308 corresponding to the lands 316 of the top device 302. The carrier device 304 also has mounting pads 314 formed on the bottom surface. In an embodiment where the carrier device 304 has one or more active devices disposed in the substrate 318, at least one of the mounting pads 314 are electrically connected to the active devices so that the carrier device 304 is in signal communication with any substrate, carrier, die or the like that the carrier device 304 is mounted to.

Figure 4:
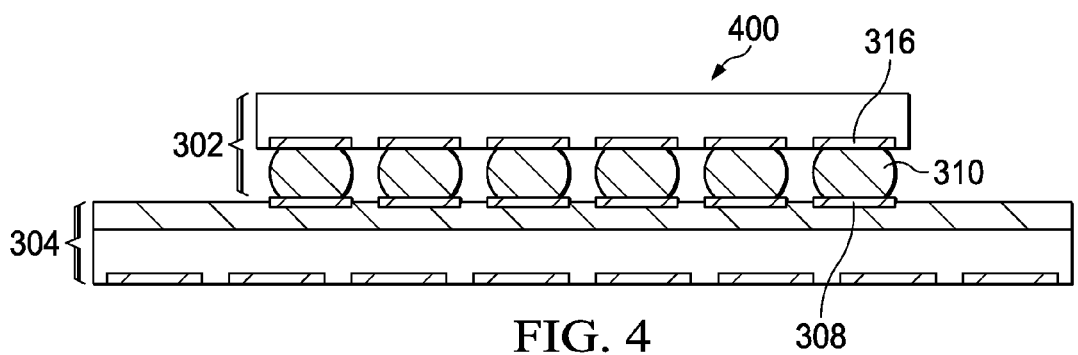

FIG. 4 is a cross-sectional view illustrating mounting of the top device 302 to a carrier device 304 to form a device stack 400 according to some embodiments. The connectors 310 are bonded to the carrier device 304, by, for example, reflowing solder or otherwise mechanically attaching the top device 302 to the carrier device 304. While a single top device 302 is illustrated, the device stack described herein is not limited to a single top device 302. For example, in some embodiments, multiple top devices 302 are mounted side-by-side on the carrier device 304, or, in other embodiments, one or more second top devices 302 are mounted on a first top device 302, which is in turn mounted on the carrier device 304.

Figure 5:
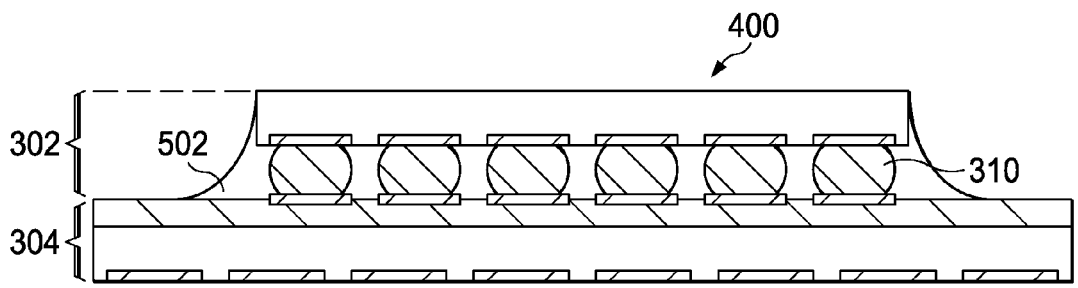

FIG. 5 is a cross-sectional view illustrating application of underfill 502 according to some embodiments. The underfill 502 is injected or otherwise applied between the top device 302 and the carrier device 304 and around the connectors 310. The underfill 502 provides protection and stability for the connection between the top device 302 and carrier device 304 and also electrically insulates the connectors 310. In an embodiment, the underfill 502 is applied as a gel or liquid material and cured after application. In such an embodiment, the underfill 502 is a thermal set epoxy, a solvent based adhesive, a polyimide, a polymer or another insulating material.

Figure 6:
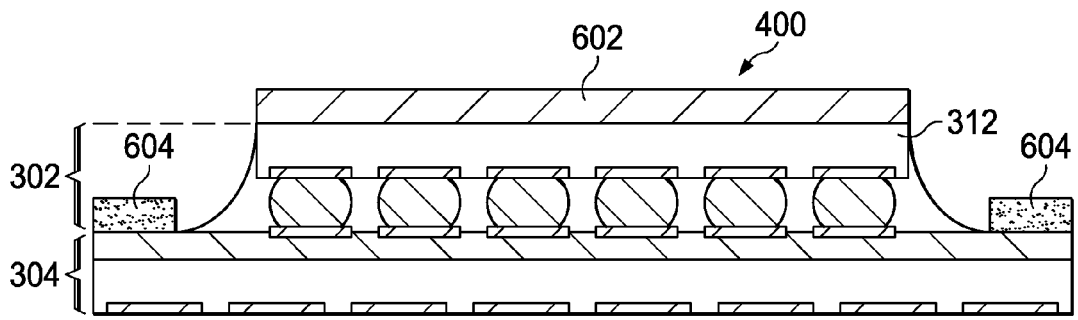

FIG. 6 is a cross-sectional view illustrating application of an adhesive 604 and thermal interface material (TIM) 602 according to some embodiments. The TIM 602 fills air gaps or imperfections in surfaces to provide a pathway or thermal sink for heat generated by those surfaces. In the illustrated embodiment, TIM 602 is applied to the top surface of the top device 302 and permits the transmission of heat from the top device 302. In an embodiment, the TIM 602 is a thermally conductive gel, paste, pad, grease, or phase change material with a thermal conductivity typically between about 0.5 W/(m·K) and 10 W/(m·K). For example, a thermal grease may be a ceramic or metal, such as beryllium oxide, aluminum nitride, aluminum oxide, zinc oxide, silver, aluminum, or the like, suspended in a silicone-based gel. In other examples, TIM 602 is a liquid metal paste of gallium alloys, or a metal alloy pad that is reflowed to adhere the TIM material to a surface.

An adhesive 604 is applied to the carrier device 304 to permit subsequent attachment of a lid to seal the device stack 400. In an embodiment, the adhesive 604 is a thermal set epoxy, a solvent based adhesive, a polyimide, a polymer or another adhesive material.

Figure 7:
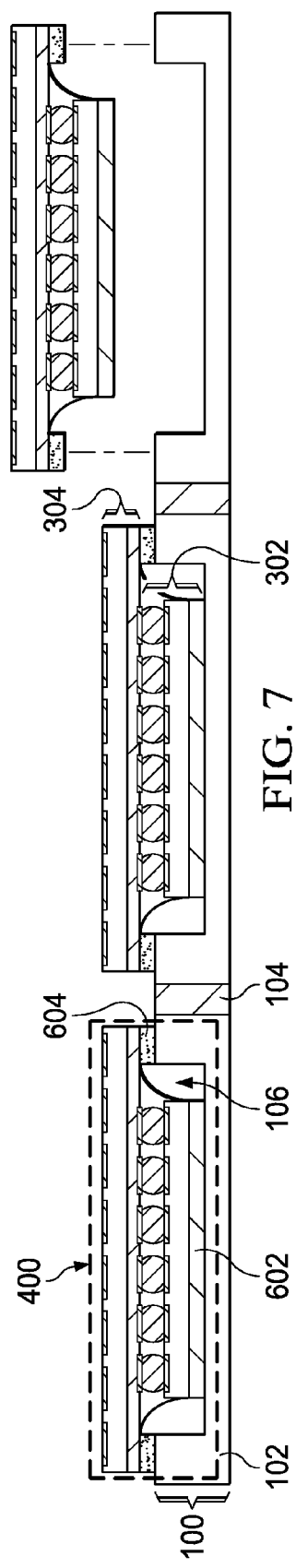

FIG. 7 is a cross-sectional view illustrating mounting device stacks 400 to the lid panel 100. The device stacks 400 are each disposed in the recess 106 of a lid 102, and the TIM 602 and adhesive 604 brought into contact with the lid 102. The lids 102 are maintained as part of the lid panel 100 to permit application of multiple device stacks 400 to the lid panel 100.

In an embodiment, the adhesive 604 is disposed around the edge of the carrier device 304, and forms a continuous loop around and encircling the top device 302 so that the carrier device 304 and lid 102 to seal the recess 106. Additionally, the TIM 602 is brought in contact with a surface of the recess 106 so that the lid 102 acts as a heat spreader or heat sink, reducing the heat retained in the top device 302.

In other embodiments, additional processing of the device stack 400 is performed during or prior to mounting the device stack on the lid panel 100. For example, an epoxy may be applied to the recesses 106 to pot the device stack 400 after the device stack 400. In other examples, the device stack 400 has other anti-tampering processes performed prior to mounting the device stack on the lid panel 100. In some embodiments, post-mounting processing is also performed after mounting the device stack 400 to the lid panel 100. For example, the adhesive 604 or TIM 602 may be thermally cured in an oven after the device stack 400 is mounted to the lid panel 100.

Figure 8:
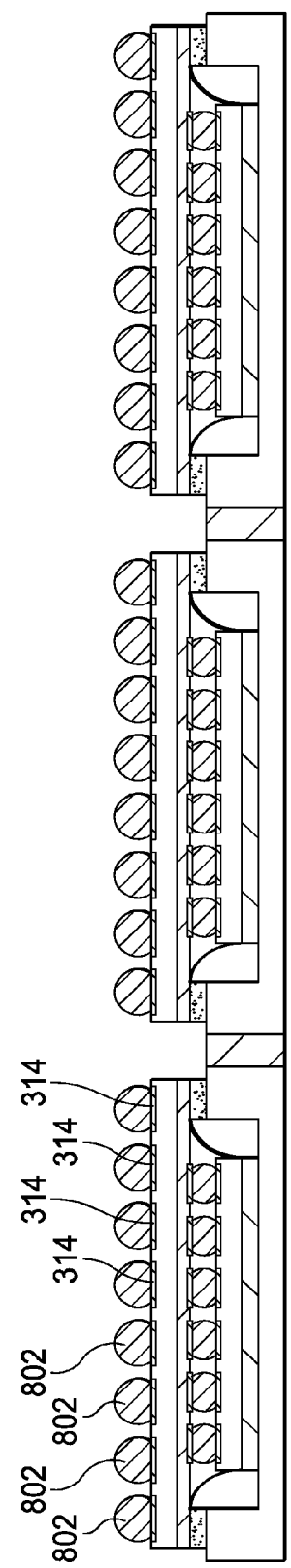

FIG. 8 is a cross-sectional view illustrating forming package connectors 802 according to some embodiments. In an embodiment, the package connectors 802 are solder balls formed on the mounting pads 314. In other embodiments, the package connectors 802 are a ball grid array (BGA), a land grid arrays (LGA), studs, wire bonds, or other conductive connectors.

Figure 9:
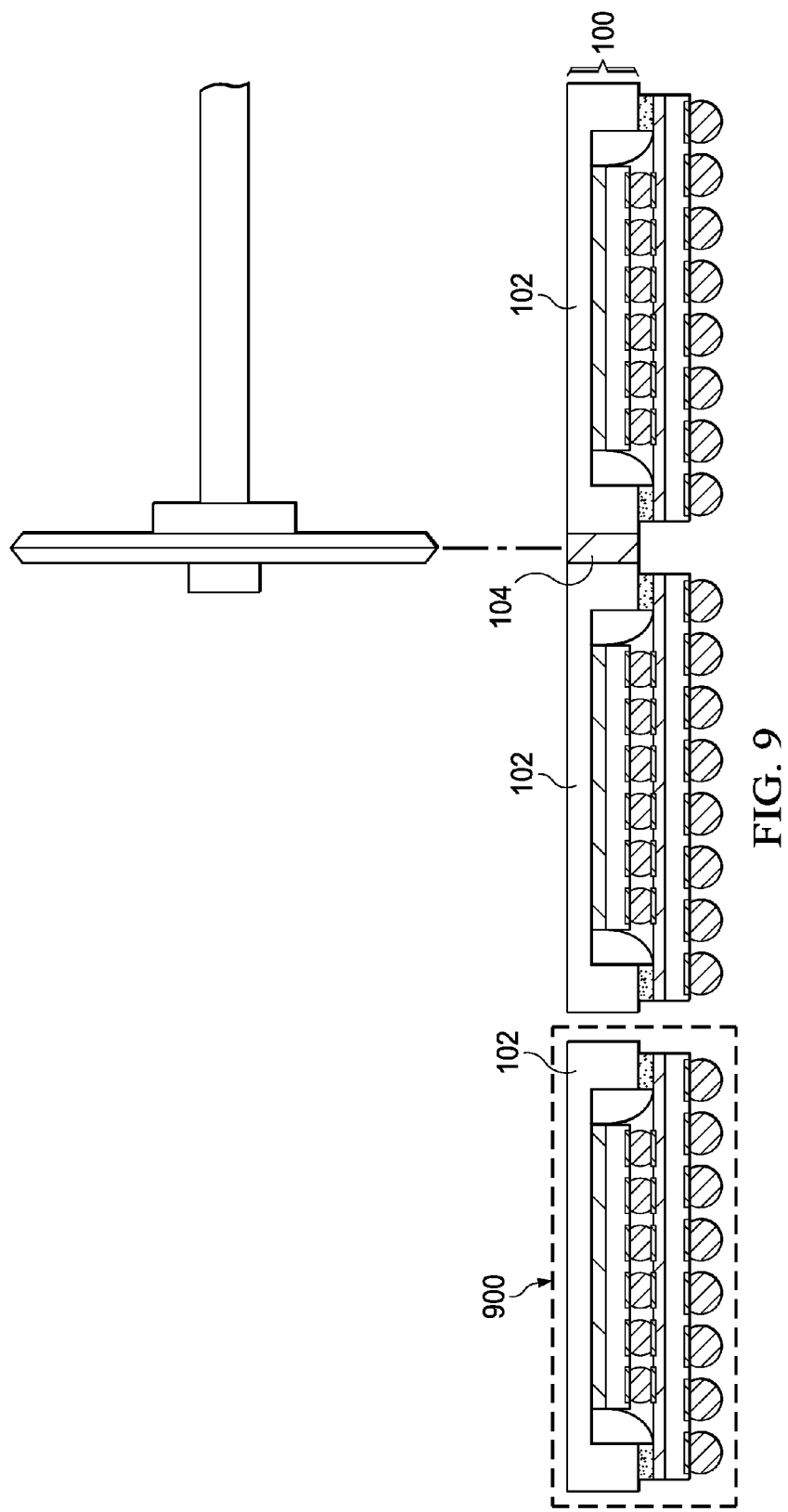

FIG. 9 is a cross-sectional view illustrating singulating packages 900 from the lid panel 100. In an embodiment, the lid panel 100 is cut from the lid side to avoid the cutting surface from coming into contact with the device stack 400. A saw, laser, waterjet, or the like cuts between the lids 102, along the dicing street 104 separating the lids 102 and singulating the package 900 from the lid panel 100. In some embodiments where a saw is used to cut the lid panel 100, the saw has a square or triangular cross section.

In an embodiment, the device stacks 400 are spaced apart when mounted to the lid panel 100. In some embodiments, cutting the lid panel 100 will comprise cutting the dicing street 104 without cutting the device stack 400. In such an embodiment, the dicing street 104 may have a width between 50 μm and about 2000 μm and the device stacks 400 may be separated by a distance greater than the dicing street width to prevent damage to the device stacks 400 during cutting. For example, the device stacks 400 may be separated by a distance that is 100um to about 500 um greater than the width of the dicing street 104. In some embodiments, the dicing street has a width between about 350 μm and about 450 μm, and the device stacks 400 may be separated by between 500 μm and about 700 μm, leaving a space between each side of the dicing street 104 and the respective device stack 400 between about 75 μm and about 125 μm.

It has been found that the close spacing of the device stacks 400 when mounted on a panel lid 100 provides greater package handling capability and speed than individual packages on a boat. The single lid panel 100 permits multiple packages to be moved onto a boat for mounting the package connectors. Additionally, the proximity of the device stacks 400 on the panel lid 100 permits more device stacks 400 to be processed in a given area than if individual packages were held on a boat.

FIG. 10A is a cross-sectional view illustrating a singulated package 900 according to some embodiments. In an embodiment, the package has a lid 102 mounted on the device stack 400, with the lid sidewall 102B extending past the outmost edge of the device stack by a lid overhang distance 904. The lid overhang distance 904 is created by the space between the dicing street 104 and the edge of the device stack 400. In an embodiment, the lid overhang distance 904 depends on the width of the dicing street 104 or the width of the device stack 400. In some embodiments, the lid overhang distance 904 is between about 0.5% and about 10% of the width of the device stack, or between about 50 μm and about 2000 μm. Such a lid overhang distance 904 provides a buffer zone during cutting the lid panel 100 to account for the cutting device deviating from the intended cutting region. For example, a device package 400 has have a width of about 5 mm, and the width of the lid 102 may be about 5.2 mm, resulting in a lid overhang distance 904 on each side of the device stack 400 that is at least about 2% of the die stack width or about 0.1 mm (100 μm). In another example, a device stack 400 has a width of about 31 mm, and the lid overhang distance 904 on each side of the device stack 400 that is about 0.6 mm (600 μm).

Additionally, in an embodiment, the lid top surface 102A and lid sidewall 102B form a lid sidewall angle 902 that is substantially 90 degrees. The lid sidewall angle 902 is created by the cutting device, and the 90 degree lid sidewall angle 902 is created, for example, by a saw blade with square teeth, by a laser, or the like.

FIG. 10B is a cross-sectional view illustrating a singulated package 900 according to some embodiments. In an embodiment, the lid top surface 102A and lid sidewall 102B form a lid sidewall angle 902 that is between about 91 degrees and about 120 degrees. Such a lid sidewall angle 902 is created, for example, by a saw blade with triangular teeth, by a waterjet, by a shearing-type blade, by a laser, or the like.

Figure 11:
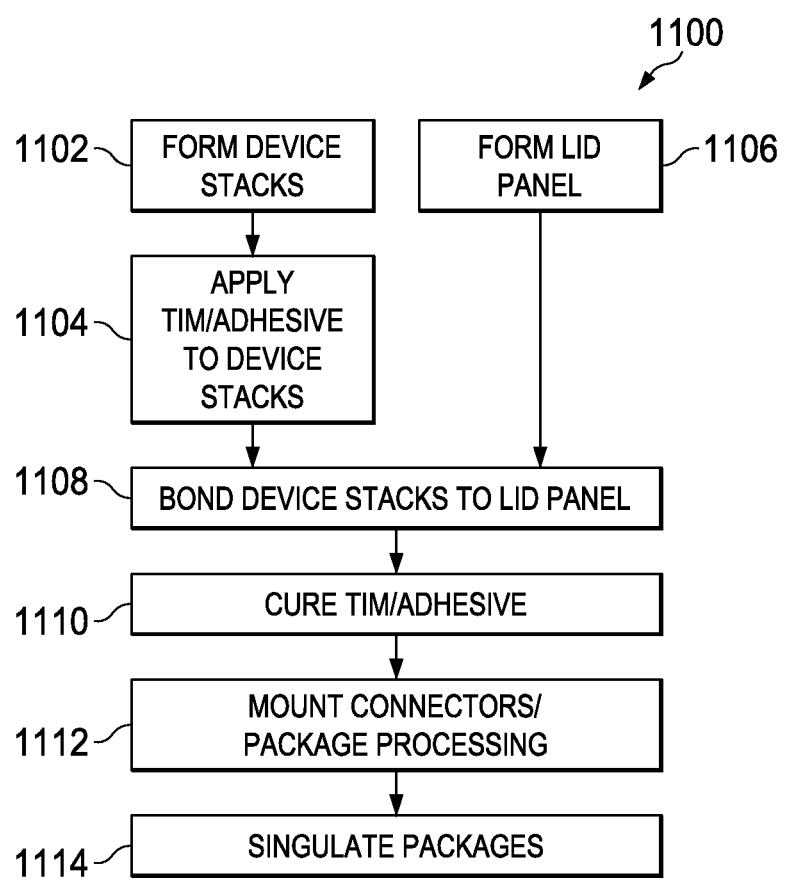
FIG. 11 is a flow diagram illustrating a method for forming packages with lids according to some embodiments.

FIG. 11 is a flow diagram illustrating a method 1100 for forming packages with lids according to some embodiments. Device stacks are formed in block 1102, and TIM or adhesive is applied to the device stacks in block 1104. A lid panel is formed in block 1106. The device stacks are attached to the lid panel in block 1108, with TIM or adhesive in contact with the lid panel. The TIM or adhesive is cured in block 1110, and additional package processing, such as mounting connectors, is performed in block 1112. The packages are singulated in block 1114 by cutting the lid panel.

Thus, a package according to some embodiments comprises a carrier device of a device stack and at least one top device of the device stack, the at least one top device mounted on a first side of the carrier device. A lid is mounted on the first side of the carrier device, a first portion of the lid attached to the carrier device and a second portion of the lid extending past and overhanging a respective edge of the carrier device. The lid comprises a recess disposed in a first side, and the at least one top device is disposed within the recess. A thermal interface material is disposed on a first side of the at least one top device and contacting a surface of the recess. The lid comprises a rim around the recess, wherein a first portion of a rim surface is attached to the first side of the carrier device. A second portion of the rim surface extends past the edge of the carrier device. In an embodiment, the first portion of the rim surface is attached to the first side of the carrier device by an adhesive, and the second portion of the rim surface is free of the adhesive. In some embodiments, an angle between a second side of the lid opposite the first side and a sidewall of the lid is between about 91 degree and 120 degrees. In some embodiments, the second portion of the lid extends past and overhangs respective edges of the carrier device by a distance that is between about 0.5% and about 10% of a width of the device stack, and in some embodiments, the second portion of the lid extends past and overhangs respective edges of the carrier device by a distance that is between about 50 μm and about 2000 μm.

A device, comprising a first die having a first width, a second die mounted on an electrically connected at a first side to a first side of the first die, and having a second width smaller than the first width, and a lid having a recess disposed in a first side and mounted at the first side to the first side of the first die, the lid having a third width greater than the first width. In an embodiment, the second die extends into the recess. A thermal interface material is disposed on a second side of the second die opposite the first side of the second die and contacts a top surface of the recess. A first portion of the first side of the lid is disposed outside of the recess and is attached to the first side of the first die by an adhesive, and a second portion of the first side of the lid is disposed outside the first portion and is free of the adhesive. In some embodiments, an angle between a second side of the lid opposite the first side and a sidewall of the lid is between about 91 degree and 120 degrees. In some embodiments, the third width is between about 101% and 120% of the second width, and the first side of the lid extends past and overhangs opposite edges of the first die by a distance that is between about 0.5% and about 10% of the first width.

A method of forming a device according to some embodiments comprises providing a plurality of device stacks each having a first die mounted on a first side of a second die, the first die having a first width, and the second die having a second width greater than the first width. A lid panel is provided, the lid panel having a plurality of lids separated by one or more dicing streets, each of the plurality of lids having a recess disposed in a first side of the respective lid, the first side of each of the plurality of lids forming a rim around the recess. Each of the plurality of device stacks is mounted on a respective one of the plurality of lids, the first side of the second die of each of the plurality of device stacks attached to the rim of the respective lid, and the first die of each of the plurality of device stacks extending at least partially into the recess of the respective lid. After the mounting each of the plurality of device stacks, the lid panel is cut along the one or more dicing streets. In some embodiments, after the mounting each of the plurality of device stacks, one or more connectors are mounted on a second side of the second die opposite the first side of the second die and the mounting one or more connectors is performed prior to the cutting the lid panel. Each of the plurality of lids has a third width greater than the second width, each of the one or more dicing streets has a fourth width, and after the mounting the plurality of device stacks, each of the plurality of device stacks is separated from adjacent ones of the plurality of device stacks by a distance greater than the fourth width. After the cutting the lid panel, each of the plurality of lids has a portion extending past an edge of the second die of the one of the plurality of device stacks mounted thereon. The cutting the lid panel is performed by cutting from a second side of the lid panel, the second side of the lid panel having the second sides of the plurality of lids opposite the first sides. After the cutting the lid panel, each of the lids has an angle between the second side of the lid and a sidewall of the lid that is between about 91 degree and 120 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a carrier device of a device stack;
at least one top device of the device stack, the at least one top device mounted on a first side of the carrier device; and
a lid mounted on the first side of the carrier device, the lid including a rim surrounding a recess and being laterally spaced apart from the recess, the rim having a lower-most surface defining a rim surface, and wherein a first portion of the rim surface is attached to the first side of the carrier device by an adhesive, and wherein a second portion of the rim surface extends past an edge of the carrier device and is free of the adhesive.

2. The package of claim 1, wherein the lid comprises a recess disposed in a first side, and wherein the at least one top device is disposed within the recess.

3. The package of claim 2, further comprising a thermal interface material disposed on a first side of the at least one top device and contacting a surface of the recess.

4. The package of claim 2, wherein an angle between a second side of the lid opposite the first side and a sidewall of the lid is between about 91 degrees and 120 degrees.

5. The package of claim 1, wherein the second portion of the lid extends past and overhangs respective edges of the carrier device by a distance that is between about 0.5% and about 10% of a width of the device stack.

6. The package of claim 1, wherein the second portion of the lid extends past and overhangs respective edges of the carrier device by a distance that is between about 50 μm and about 2000 μm.

7. A device, comprising:
a first die having a first width;
a second die mounted on and electrically connected at a first side to a first side of the first die, and having a second width smaller than the first width; and
a lid having a recess disposed in a first side and mounted at the first side to the first side of the first die, the lid having a third width greater than the first width; and
wherein a first portion of the first side of the lid is disposed outside of the recess and is attached to the first side of the first die by an adhesive, and wherein a second portion of the first side of the lid is disposed outside the first portion and is free of the adhesive.

8. The device of claim 7, wherein the second die extends into the recess.

9. The device of claim 7, further comprising a thermal interface material disposed on a second side of the second die opposite the first side of the second die and contacting a top surface of the recess.

10. The device of claim 7, wherein an angle between a second side of the lid opposite the first side and a sidewall of the lid is between about 91 degrees and 120 degrees.

11. The device of claim 7, wherein the third width is between about 101% and 120% of the second width, and wherein the first side of the lid extends past and overhangs opposite edges of the first die by a distance that is between about 0.5% and about 10% of the first width.

12. A device, comprising:
a lid panel comprising a plurality of lids separated by one or more dicing regions having a first width, each lid having a recess disposed in a first side of the lid and a rim surrounding each recess, each lid having a second width;

a plurality of device stacks, each of the plurality of device stacks mounted in the recess of a respective one of the plurality of lids, each of the plurality of device stacks comprising:

a carrier device having a third width; and at least one top device mounted on a first side of the carrier device, the at least one top device having a fourth width, the second width being greater than the third width, and the third width being greater than the fourth width.

13. The device of claim 12, further comprising a layer of thermal interface material disposed on a top surface of the at least one top device and contacting the recess of a respective lid.

14. The device of claim 12, further comprising an adhesive layer disposed on outer portions of the first side of the carrier device, the adhesive layer contacting the rim of a respective lid.

15. The device of claim 12, wherein a top surface of the one or more dicing streets is coplanar with a top surface of the plurality of lids, and wherein a bottom surface of the one or more dicing streets is coplanar with a top surface of the rims of the lids.

16. The device of claim 12, wherein a top surface of the one or more dicing streets is below a top surface of the plurality of lids, and wherein a bottom surface of the one or more dicing streets is above a top surface of the rims of the lids.

17. The device of claim 12, wherein the plurality of lids are separated by a fifth width, the fifth width being greater than the first width.

* * * * *